May 30, 1950 R. M. CROOKER 2,509,761

SAWTOOTH VOLTAGE GENERATOR

Filed March 16, 1948

INVENTOR.
Robert M. Crooker
BY
Freeman L. Mueller
Atty.

Patented May 30, 1950

2,509,761

UNITED STATES PATENT OFFICE 2,509,761

SAW-TOOTH VOLTAGE GENERATOR

Robert M. Crooker, Chicago, Ill., assignor to Motorola, Inc., Chicago, Ill., a corporation of Illinois Application March 16, 1948, Serial No. 15,111

4 Claims. (Cl. 250—36)

This invention relates generally to oscillator circuits and more particularly to a generator for producing sawtooth voltage waves in a television system utilizing electrostatic deflection.

In television receiver systems, a cathode ray tube is provided having a beam which is caused to scan a rectilinear pattern on the screen of the tube to produce an image. The deflection of the cathode ray beam can be produced by either an electrostatic or an electromagnetic field through which the beam is projected, and the present invention relates to means for producing voltages for producing such an electrostatic fiield. It is apparent that in such a system the amount of deflection of the beam depends upon the strength of the field which in turn depends upon the amplitude of the sawtooth voltage waves applied thereto. In order to produce a linear trace of the beam on the screen the voltage waves applied to the plates must rise linearly. In present television systems the beam is extinguished during the retrace portion of the cycle, and it is desired that the time required for the retrace be held to a minimum. These factors all limit the design of the deflecting generators which will produce the desired deflection in a television system.

Although deflection generators have been built, which have been generally satisfactory in operation, these generators have been subject to several defects. First, the generators have been relatively complicated and, therefore, have been expensive to produce. Another disadvantage has been that in order to produce voltages of the amplitude necessary to produce the required deflection of the beam, a relatively high voltage source is required for the deflection generator. Such a high voltage direct current source results in a relatively expensive power supply for the television receiver as a whole and which is obviously not desirable. Available deflection generators have also been very inefficient requiring a large amount of power, further adding to the cost and complexity of the over-all power supply system.

It is, therefore, an object of the present invention to provide a deflection generator which produces balanced sawtooth voltage waves of maximum amplitude from a voltage source of predetermined limited value.

Another object of this invention is to provide a voltage generator which produces a sawtooth wave having a fast retrace portion and in which a relatively large portion of the wave forms a substantially linear trace.

A feature of this invention is the provision of a voltage generator including a condenser and a blocking oscillator for discharging the condenser in which the windings of the blocking oscillator transformer are damped to reduce distortion of the voltage wave produced across the condenser.

Another feature of this invention is the provision of a voltage generator including a condenser across which the sawtooth voltage is developed and a circuit including the condenser arranged to be conducting for sufficient time so that a free oscillation of one-half cycle duration is produced therein during which the condenser is discharged and then charged to the opposite polarity.

A still further feature of this invention is the provision of a condenser across which a sawtooth voltage wave is produced and a blocking oscillator for discharging the condenser and charging the same to the opposite polarity in which the condenser is of such value that the voltage produced thereacross is maximum, with the value of the condenser and inductance of the blocking oscillator windings being so related that the condenser is rapidly discharged, the windings of the blocking oscillator being damped to reduce distortion of the sawtooth voltage wave.

Further objects, features and advantages will be apparent from a consideration of the following description taken in connection with the accompanying drawings in which.

Figures 1, 2, 3:
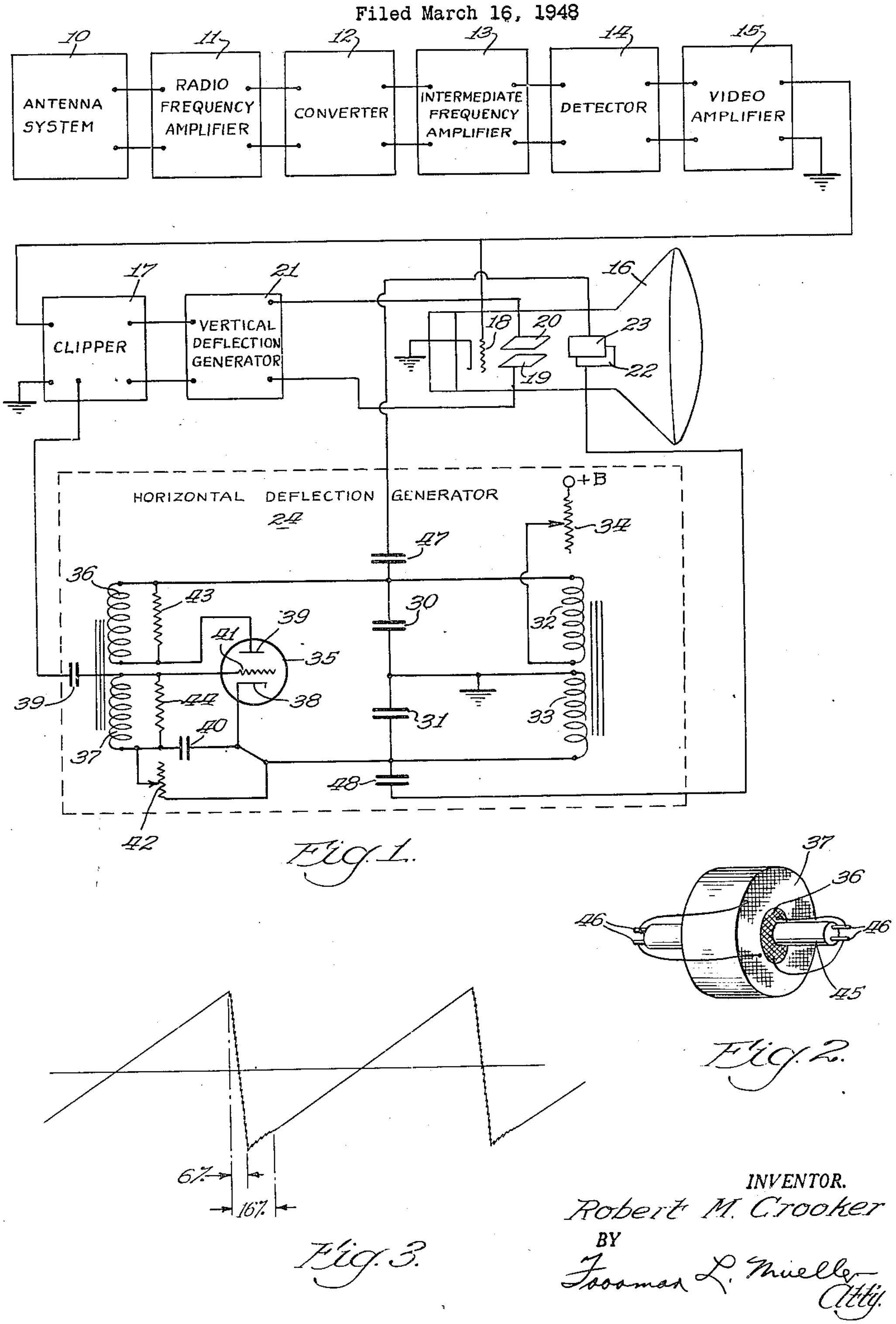
Fig. 1 is a schematic diagram illustrating a television receiver including a horizontal deflection generator in accordance with the invention.
Fig. 2 illustrates the construction of the blocking oscillator transformer of the deflection generator.
Fig. 3 illustrates the wave form of the output voltage of the generator.

In practicing the invention there is provided a television receiver including a sawtooth voltage generator for producing horizontal deflection of the beam of the cathode ray tube. In order to receive in the present television receiver the television signals meeting the standards prescribed by the Federal Communications Commission and now being transmitted, the sawtooth generator must operate at a frequency of 15,750 cycles per second. The deflection generator includes a condenser which is charged at a rate to provide a linearly increasing voltage thereacross. The charging circuit for the condenser includes a relatively large inductor which is closely coupled to a second identical inductor. The second inductor is connected to a second condenser so that the charging current through the inductors causes a voltage to be developed across the second condenser which is of opposite polarity to the voltage developed across the first condenser. The voltage waves from the two condensers are applied to the horizontal deflection plates of the cathode ray tube for deflecting the beam thereof. A blocking oscillator circuit is provided for discharging the condensers and includes a tube coupled thereto so that when a particular voltage is produced across the condensers, the tube conducts and remains conducting while the circuit including the condensers oscillates freely for one-half cycle so that the condensers are discharged and then charged in the opposite direction. The first condenser is of such value that the desired voltage will be produced thereacross. The value of the condensers and primary winding of the blocking oscillator transformer is such that the condensers will be discharged rapidly. The value of the constants in the plate circuit of the blocking oscillator including the condensers are such that the circuit will oscillate freely for one-half cycle while the tube is conducting so that the condenser will be charged in the opposite direction and the energy in the system is retained.

Referring now more particularly to the drawings, in Fig. 1 there is disclosed a television receiver including an antenna system 10 for selecting waves of the desired frequency. The waves are then applied to radio frequency amplifier 11 wherein they are further selected and amplified. Converter 12 is provided for reducing the radio frequency waves to intermediate frequency waves which are further selected and amplified in intermediate frequency amplifier 13. The video signal is derived from the intermediate frequency wave by detector 14 and amplified in video amplifier 15. The video signals are then applied to the cathode ray tube 16 and to clipper 17. Although means for producing an audio signal are not disclosed, an audio system may be provided in the television receiver in any one of several ways which are well known in the art.

The video signal is applied to the grid 18 of the cathode ray tube 16 for modulating the intensity of the beam produced thereby. In order to reconstruct the image, the beam is deflected as by vertical deflection plates 19 and 20 and horizontal deflection plates 22 and 23. The plates 19 and 20 are connected to vertical deflection generator 21 which is held in synchronism by signals applied thereto from clipper 17. Similarly, horizontal deflection of the cathode ray beam is produced by horizontal deflection plates 22 and 23 which are connected to horizontal deflection generator 24 to which synchronization signals are applied by clipper 17. The horizontal and vertical deflection generators are so synchronized with each other and with the picture signal that the image represented by the signal is reproduced on the screen of the tube 16.

Referring now more particularly to the horizontal deflection generator 24, the generator includes a pair of identical condensers 30 and 31 and a pair of identical inductors 32 and 33. The inductors 32 and 33 are very closely coupled, 100 per cent coupling being desirable. It is noted that the condenser 30 is connected in series with inductor 32 and variable resistor 34 between plus B potential and ground. This series circuit provides an increasing charging current for the condenser 30 so that the voltage thereacross builds up linearly. As the inductors 32 and 33 are closely coupled a similar current will be induced in inductor 33 to charge condenser 31. The coils are phased in such manner so that when a positive voltage is built up on condenser 30 a negative voltage will be developed across condenser 31. The voltages on the condensers 30 and 31 are applied to the deflection plates 23 and 22, respectively, through coupling condensers 47 and 48. Connected across the condensers 30 and 31 is a blocking oscillator including a triode electron discharge valve 35 and a transformer including windings 36 and 37.

The transformer is illustrated in Fig. 2 which shows the windings 36 and 37 wound on a form 45. The winding 36 is wound directly on the form 45 and the winding 37 is wound about the windings 36. This provides a very compact unit and one in which the desired coupling between the turns is provided. The windings are of the universal type providing low capacity. The form 45 may have conducting members 46 embedded therein through which connection may be made to the windings 36 and 37. The valve 35 includes a cathode 38 and plate 39 across which the winding 36 and condensers 30 and 31 are connected in series. The winding 37 is connected in series with a condenser 40 between the cathode 38 and the grid 41 of the valve 35. A variable resistor 42 is provided across condenser 40 for discharging the same, and fixed damping resistors 43 and 44 are provided across the windings 36 and 37 respectively.

Considering now the operation of the generator 24, when the condensers 30 and 31 are charged to predetermined values, the voltage of the condensers, which is additive, applied across the output electrodes of the tube 35 will cause the tube to conduct. Current in the plate circuit will be furnished through windings 36 and 37 to the grid circuit to provide a positive bias on the grid 41 so that the action of the tube will be accelerated. The grid current, however, will cause a charge to be built up on condenser 40 in such a direction to cut off the tube. The condensers 30 and 31 will then be charged again from the plus B potential in the manner just described. During the trace, the charge on condenser 40 will be removed through resistor 42 so that the tube 35 will be in condition to conduct when the condensers 30 and 31 are charged to the predetermined value. It is to be pointed out that each of the condensers 30 and 31 may be charged to a voltage higher than that of the plus B supply. This is because the inductors 32 and 33 are very large and the charging current will continue to flow therethrough until the voltage on the condensers is much greater than that of the plus B supply if the blocking oscillator does not fire to discharge the condenser. The oscillator is adjusted to fire while the voltage being built up on the condensers is linear and does not allow the condensers to charge to the maximum value. The transfer of energy through the blocking oscillator transformer causes the positive bias to be quickly built up on the grid 41 so that the conductivity of the tube is increased value, increase in size of the condenser results in a decrease in the amplitude of the sawtooth wave. The value of condenser 30 has been found to be critical at 900 micromicrofarads plus or minus approximately 10 per cent. Likewise the ratio of the turns and inductances of the windings 36 and 37 may vary through a range and still provide the desired transfer of energy between the plate and grid circuits to produce the retrace portion of the sawtooth wave. It has been found that the inductance of the primary windings may vary from 8.1 to 9.1 millihenries. At lower values the size is too small and at larger values, the retrace is too slow. The inductance of the secondary winding 37 should be from 2 to 6 times that of the primary winding in order to provide maximum size. By increasing the secondary inductance, the transfer of energy to the grid circuit of the tube is increased and the conductivity of the tube is increased rapidly. This reduces the energy consumed in the retrace oscillation so that the maximum negative value closely approaches the maximum positive value. As previously stated, the plate circuit of the tube 35 should have such a resonant frequency that a free oscillation of one-half cycle duration is produced during the time the tube 35 conducts. This is controlled by the inductance of winding 36, resistor 43, condensers 30 and 31, and the plate-cathode resistance and capacitance of the tube 35. The damping resistors 43 and 44 across the windings 36 and 37 of the blocking oscillator must be sufficiently large to provide effective damping but if they are made too large, they will consume sufficient energy to reduce the amplitude variation of the sawtooth waves. The values specified above have been found to be most satisfactory in the system disclosed but these values may vary therefrom in the order of 10 per cent with satisfactory results.

The deflection generator disclosed provides balanced push-pull sawtooth voltage waves for operation of the deflection plates of an electrostatic deflection system and provides adequate amplitude variation for deflection of a seven inch cathode ray tube from a voltage source of the order of 235 volts. This permits operation of the generator from a simple rectifier doubler power supply. The large amplitude variation results from the reverse charging of the condensers, which also provides high efficiency in the generator. The retrace of the wave is sufficiently fast that the distorted portion of the trace of the wave can be blanked out. This is possible because the distorted portion is made small by the damping resistors across the windings of the blocking oscillator transformer. The system is comparatively simple and inexpensive and requires only one triode vacuum tube which may be a section of a multi unit tube.

While I have described what I consider to be the preferred embodiment of my invention, it is obvious that various changes and modifications can be made therein without departing from the intended scope of the invention as defined in the appended claims.

I claim:

1. A deflection generator for use in a television receiver for causing the beam of the cathode ray tube thereof to scan the screen horizontally at a frequency of more than 15,000 cycles per second, with the beam varying in intensity during approximately 84% of each cycle to form a picture and being blanked out for approximately 16% of each cycle, said generator producing a sawtooth voltage wave having trace and retrace portions and comprising, condenser means, means for charging said condenser means so that the voltage thereacross builds up linearly to provide said trace portion of said sawtooth wave, a blocking oscillator including an electron discharge valve and a transformer having primary and secondary windings, said condenser means and said primary winding being connected in series across said electron discharge valve, damping means coupled to said windings of said transformer for absorbing energy therefrom, said valve being rendered conductive in response to a predetermined voltage across said condenser means to provide a closed circuit through said condenser means and said primary winding so that an oscillation of one-half cycle duration takes place therein during which said condenser means is discharged and charged to the opposite polarity to form said retrace portion of said sawtooth wave, said blocking oscillator producing distortions in said trace portion of said sawtooth wave which are maximum immediately following said retrace portion and which diminish as said trace portion progresses, the capacity of said condenser means and the inductance of said primary winding being so related that said retrace portion has a duration of the order of 6% of each cycle so that the part of each trace portion having maximum distortion is included in said blanked out part of each cycle, said damping means having such characteristics that said distortions in said trace portion which follow said blanked out part are substantially damped out so that the remaining part of said trace portion is substantially linear and extends for approximately 84% of each cycle.

2. A deflection generator in accordance with claim 1 in which said damping means comprises a pair of impedance means individually bridged across said primary and secondary windings of said transformer.

3. A generator for producing a sawtooth voltage wave having a frequency of more than 15,000 cycles per second and including trace and retrace portions with the part of each trace portion extending for approximately 84% of each cycle being substantially linear, said generator comprising, condenser means, means for charging said condenser means so that the voltage thereacross builds up linearly to provide said trace portion of said sawtooth wave, a blocking oscillator including an electron discharge valve having input and output electrodes and a transformer having primary and secondary windings, said condenser means and said primary winding being connected in series directly across said output electrodes of said electron discharge valve, said secondary winding being coupled to said input electrodes of said electron discharge valve, damping means coupled to said windings of said transformer for absorbing energy therefrom, said valve being rendered conductive in response to a predetermined voltage across said condenser means to provide a closed circuit through said condenser means and said primary winding so that an oscillation of one-half cycle takes place therein during which said condenser means is discharged and charged to the opposite polarity to form said retrace portion of said sawtooth wave, said blocking oscillator producing distortions in said trace portion of said sawtooth wave which are maximum immediately following said retrace portion and which diminish as said trace portion progresses, the capacity of said condenser and the condensers 30 and 31 are very rapidly discharged.

When used in a television receiver, the horizontal deflection generator 24 is adapted to be held in step by synchronization pulses. The pulses are applied through condenser 39 to the grid 41 of the valve 35. The generator will be adjusted to have a free running frequency just slower than the frequency of the horizontal synchronization pulses. The valve 35 will, then, be just about ready to conduct when each synchronization pulse is received so that pulses of small amplitude when applied to the grid 41 will render the valve 35 conducting and start the retrace of the sawtooth wave.

It is apparent that the value of the various components of the system determine the rate at which the voltage across the condensers builds up, the amplitude which the voltage reaches, and the retrace characteristics produced by the blocking oscillator. The frequency of the oscillator is fixed by present television standards at 15,750 cycles per second. It is apparent that by increasing the size of the condensers 30 and 31 the maximum amplitude of the sawtooth voltage waves can be increased. However, to provide rapid retrace it is desired that the condensers be as small as possible. Accordingly, the value of the condensers must be fixed at an optimum value for producing the size required with rapid retrace characteristics. Similarly, the inductance of windings 36 and 37 is preferably large to provide the required transfer of energy from the plate to the grid circuit, and the inductance of winding 36 should on the other hand be small so that the condensers can be rapidly discharged therethrough. Therefore, the inductance of the windings 36 and 37 must be chosen to have values and coupling to provide the required transfer of energy and still be effective to permit rapid discharge of the condensers. In order to conserve energy and produce the greatest effective amplitude in the sawtooth waves the output circuit of the tube 35 including winding 36 and condensers 30 and 31 should have a natural frequency of oscillation so that during the time the tube 35 conducts a free oscillation of one-half cycle duration will take place. This result is obtained because the condenser 30 is first charged to a positive value and then after being discharged is charged to a negative value which approaches the former positive value being reduced only by the losses in the oscillating circuit. The condenser 30 will then be charged to a positive voltage by the plus B source so that the amplitude variation across the condenser will be the sum of the positive and negative values. The condenser 31 will produce a similar voltage wave which is of the opposite polarity. It is apparent that by adjusting the energy transfers of windings 36 and 37 and the value of condenser 40, the tube 35 can be made to conduct just long enough to provide a half cycle of oscillation in the output circuit thereof. As it is preferable that this free oscillation, which produces the retrace, be of as short duration as possible, it is necessary that the transfer of energy be maximum.

It has been observed when inspecting the operation of the generator that the retrace oscillation is not a smooth curve but includes distortion as is illustrated in Fig. 3. This distortion carries over after the tube 35 is cut off and appears at the beginning of the trace portion of the wave. Such distortion is undesirable and results in vertical lines or bars in the picture when such a sawtooth wave is applied to the horizontal deflection plates thereof. In order to limit this distortion, damping resistors 43 and 44 are provided across the windings 36 and 37. These damping resistors are effective to reduce the distortion but also have the disadvantage that energy is consumed thereby and the amplitude variations of the sawtooth wave are reduced. Accordingly, it has been found practical to damp the winding sufficiently to remove only a part of the distortion produced in the sawtooth wave. To further render the distortion of the wave ineffective, it has been found that when used as a deflection generator in a television system, the portion of the trace of the wave having the greatest distortion need not be used. In a standard television signal the beam of the tube is blanked during 16 per cent of each cycle to permit horizontal retrace of the beam. That is, the beam is effective to produce a line in the picture only during 84 per cent of each cycle of the horizontal deflection generator. By making the retrace of the wave very fast so that less than 16 per cent of the time is required therefor, a certain portion of the trace of the wave will be ineffective as the beam will be blanked out. This is illustrated in Fig. 3 wherein the sawtooth wave has a retrace taking up only 6 per cent of the time in each cycle so that as much as 10 per cent of the trace can be blanked out. By providing such a fast retrace, the distorted portion of the sawtooth wave remaining after proper damping can be entirely included in the blanking period and will, therefore, not affect the picture.

As stated above, in order to provide the desired results the values of the various components are relatively critical. The following values have been found to be satisfactory for providing deflection waves having an amplitude variation of approximately 450 volts from a source of potential of the order of 235 volts:

| | |
|---|---|
| Condenser 30 | 900 micromicrofarads |
| Condenser 31 | 900 micromicrofarads |
| Inductor 32 | 4 henries |
| Inductor 33 | 4 henries |
| Resistor 34 | 20,000 ohms (variable) |
| Coupling between inductors 32 and 33 | Approaching 100% |
| Tube 35 | One section of 12SN7 |
| Winding 36 | 8.5 millihenries |
| Winding 37 | 30 millihenries |
| Turn ratio of winding 36 to winding 37 | 1 to 1.7 |
| Coupling between windings 36 and 37 | 75% |
| Condenser 40 | .01 microfarad |
| Resistor 42 | 20,0000 ohms (variable) |
| Resistor 43 | 39,000 ohms |
| Resistor 44 | 27,000 ohms |
| Condenser 47 | .001 microfarad |
| Condenser 48 | .001 microfarad |
| Condenser 49 | 25 micromicrofarads |

Although these values have been found to be somewhat critical, it is, of course, obvious that satisfactory operation can be provided using other values than those specifically listed. Also to provide particular results, values other than these may be preferable. When using a winding 36, having an inductance of 8.5 millihenries, it is found that the amplitude variation in the voltage wave increases with increase in the value of condenser 30 until a value of approximately 900 micromicrofarads is reached. Above this means and the inductance of said primary winding being so related that said retrace portion is of a duration of approximately 6% of each cycle, said damping means having such characteristics that said distortions in said trace portion are substantially damped out after a duration of approximately 10% of each cycle so that the remaining part of said trace portion of said sawtooth wave forms a substantially linear voltage trace which extends for approximately 84% of each cycle.

4. A generator in accordance with claim 3 in which said condenser means includes a pair of condensers connected in series with each having a value of the order of 900 micromicrofarads, said primary winding has an inductance of the order of 8.5 millihenries, and said damping means includes a resistor connected across said primary winding having a resistance of the order of 39,000 ohms.

ROBERT M. CROOKER.

REFERENCES CITED

The following references are of record in the file of this patent:

UNITED STATES PATENTS

| Number | Name | Date |
|---|---|---|
| 2,052,183 | Lewis et al. | Aug. 25, 1936 |
| 2,118,977 | Lewis et al. | May 31, 1938 |
| 2,140,004 | Falloon | Dec. 13, 1938 |
| 2,188,653 | Faudell et al. | Jan. 30, 1940 |
| 2,212,202 | Faudell et al. | Aug. 20, 1940 |
| 2,302,161 | Woerner | Nov. 17, 1942 |
| 2,412,210 | Edson et al. | Dec. 10, 1946 |
| 2,458,366 | Fyler | Jan. 4, 1949 |